United States Patent
Hira et al.

(10) Patent No.: US 6,836,446 B2
(45) Date of Patent: Dec. 28, 2004

(54) SEMICONDUCTOR MEMORY DEVICE

(75) Inventors: Masayuki Hira, Ibaraki (JP); Yasushi Ichimura, Kasama (JP); Takahiro Matsuzawa, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/635,628

(22) Filed: Aug. 6, 2003

(65) Prior Publication Data

US 2004/0076045 A1 Apr. 22, 2004

(30) Foreign Application Priority Data

Sep. 5, 2002 (JP) ........................................ 2002-259987

(51) Int. Cl.[7] .............................................. G11C 8/00
(52) U.S. Cl. ........................... 365/230.03; 365/230.08; 365/189.05
(58) Field of Search ....................... 365/230.03, 230.06, 365/189.05, 203, 207, 190

(56) References Cited

U.S. PATENT DOCUMENTS 6,026,045 A * 2/2000 Son ...................... 365/230.03

* cited by examiner

*Primary Examiner*—David Lam
(74) *Attorney, Agent, or Firm*—Alan K. Stewart; W. James Brady, III; Frederick J. Telecky, Jr.

(57) ABSTRACT

The semiconductor memory device has a memory capacity that can be increased without increasing the load to bit lines and has increased access speed. Because the output lines of bit line selector circuits 20 through 27 are precharged by charge circuits 30 through 37, and selectable bit lines (SBL, SBLZ) reach a high level before access is gained for reading from memory cells, data read previously is held unchanged for output signal SAOUT of data latch circuit 70. Because output lines of bit line selector circuits 20 through 27 are all at the high level even when another gate circuit becomes conductive as a new read address is set, the selected bit lines remains at the high level, and data previously read is held unchanged for output signal SAOUT of data latch circuit 70. Output signal SAOUT of data latch circuit 70 is changed to the next data read as soon as differential amplification operation of the bit lines is completed by amplifier circuits 40 through 47.

7 Claims, 5 Drawing Sheets

SEMICONDUCTOR MEMORY DEVICE

FIELD OF THE INVENTION

The present invention pertains to a semiconductor memory device. More specifically, it pertains to a semiconductor memory device which reads stored data by switching output signals from plural sense amplifiers.

BACKGROUND OF THE INVENTION

A method in which the number of memory cells connected to bit lines is increased is presented as a relatively simple method for increasing the storage capacity of a semiconductor memory device, such as an SRAM. However, the capacitive constituents of the memory cells increase with the number of memory cells, and the capacitive constituents of the bit lines also increase as they become longer, creating the problem that the memory cells driving the bit lines are more heavily loaded. Because the driving capability of a transistor utilized for a memory cell is subject to limits imposed by the type of manufacturing process, the use of said method to increase the storage capacity is thereby also limited.

Thus, a method in which the number of bit lines is increased is widely used as another method for increasing the storage capacity.

Figure 7:
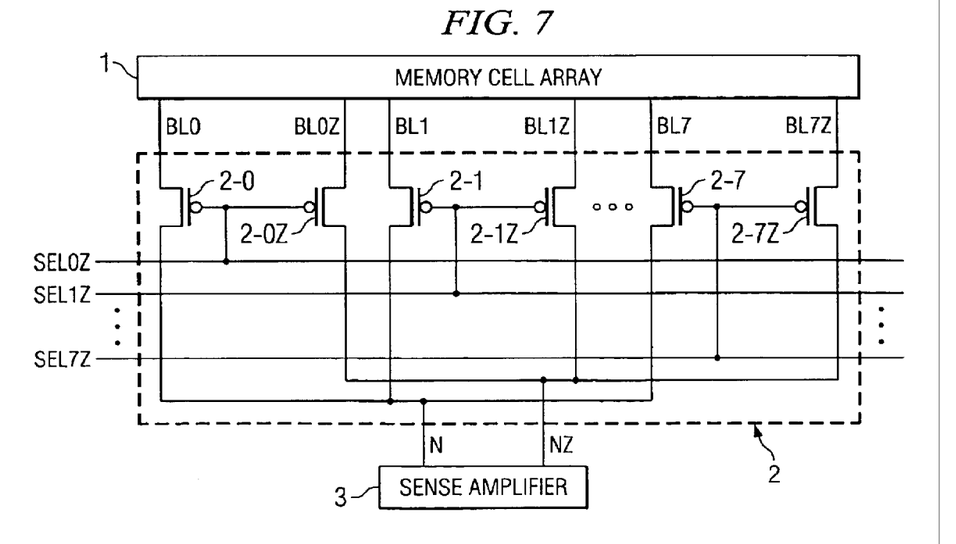
FIG. 7 is a block diagram of an example configuration of a semiconductor memory device in which the number of bit lines is increased eight times.

FIG. 7 is a block diagram of an example configuration of a semiconductor memory device in which the number of bit lines is increased light times.

The semiconductor memory device shown in FIG. 7 has memory cell array 1, bit line selector circuit 2, and sense amplifier 3.

Memory cell array 1 has memory cells arranged in rows and columns, and the memory cells in respective columns are connected to bit line pairs (BL0, BL0Z) through (BL7, BL7Z). Although not shown specifically, memory cells in each row are connected to a common word line, and access is gained to memory cells connected to an activated word line via applicable bit line pair (BL0, BL0Z) through (BL7, BL7Z).

Bit line selector circuit 2 selects among bit line pairs (BL0, BL0Z) through (BL7, BL7Z) according to bit line selection signal SEL0Z through SEL7Z and outputs the signals on the selective bit line pair to sense amplifier 3.

In the example illustrated in FIG. 7, bit line selector circuit 2 has p-type MOS transistors 2-0 through 2-7 and p-type MOS transistors 2-0Z through 2-7Z.

Bit lines BL0 through BL7 on one side of the bit line pairs are connected to common output line N, and bit lines BL0Z through BL7Z on the other side are connected to common output line NZ. In addition, p-type MOS transistors 2-0 through 2-7 are inserted into the connecting lines between bit lines BL0 through BL7 and output line N, and p-type MOS transistors 2-0Z through 2-7Z are inserted into the connecting lines between bit lines BL0Z through BL7Z and output line NZ. Bit line selection signals SEL0Z through SEL7Z are input to the gates of p-type MOS transistors 2-0 through 2-7, and bit line selection signals SEL0Z through SEL7Z are input also to the gates of p-type MOS transistors 2-0Z through 2-7Z.

Sense amplifier 3 amplifies the small difference in voltage of bit line pair selected by bit line selector circuit 2 during a read of data stored in the memory cells. The value of the data stored in a memory cell is identified on the basis of said amplified voltage difference.

In the case of the semiconductor memory device in FIG. 7, to read the data stored in the memory cells, one of bit line selection signals SEL0Z through SEL7Z is set to a low level according to the address to be read. Thus, the p-type MOS transistor which received the low-level bit line selection signal through its gate conducts, and the signal from one of bit line pairs (BL0, BL0Z) through (BL7, BL7Z) is output to sense amplifier from output line N and NZ 3 via the conducting p-type MOS transistor.

On the other hand, when a word line of memory cell array 1 is activated in response to said read address, bit line pair (BL0, BL0Z) through (BL7, BL7Z) is driven by the memory cells connected to the activated word line, and the voltage difference corresponding to the data stored in the memory cell is generated on bit line pair (BL0, BL0Z) through (BL7, BL7Z).

Sense amplifier 3 amplifies the voltage difference on the single bit line pair from the bit line pairs selected by bit line selector circuit 2, and the value of the stored data is identified on the basis of said voltage difference.

Thus, with the semiconductor memory device in FIG. 7, the memory capacity can be increased by selecting I bit line pair from the plural bit line pairs using the selector circuit. However, the aforementioned method has the problem that the selector circuit itself used for bit line selection loads the memory cells. For example, the capacitive constituents of p-type MOS transistors 2-1 through 2-7 of bit line selector circuit 2 are also added to the capacitive constituents of the memory cells as the load of bit line BL0 of the semiconductor memory device in FIG. 7. As the number of the bit line pairs is further increased, the load due to the capacitive constituents of the transistors of the selector circuit increases.

Thus, as the number of the bit line pairs is increased, often the method is used in which plural bit line selector circuits and plural sense amplifiers are used, with the output signals being switched.

Figure 8:
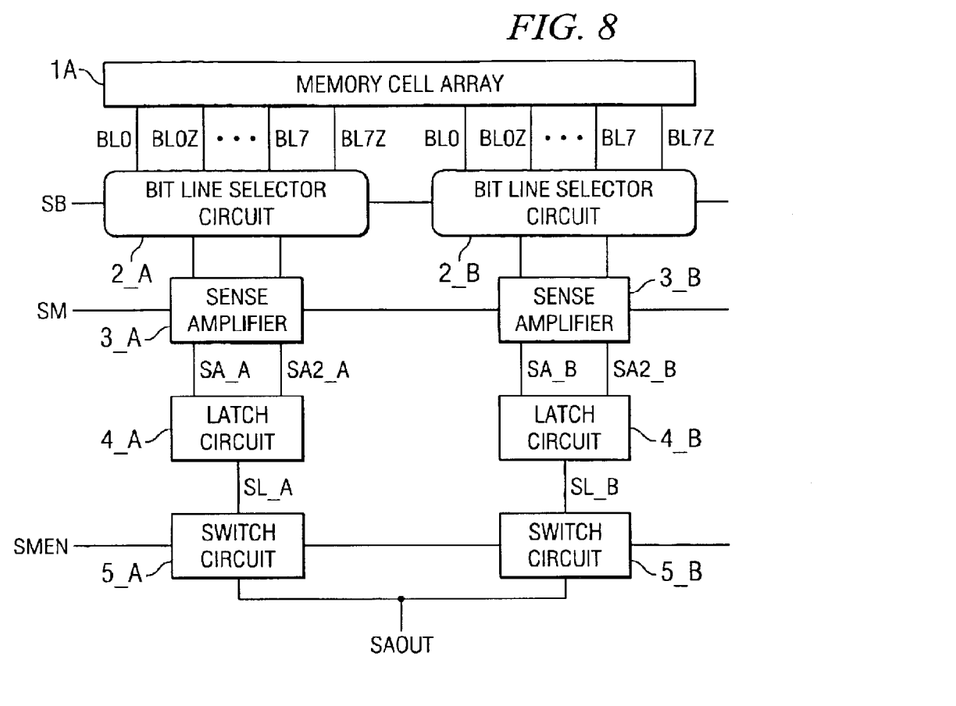
FIG. 8 is a block diagram illustrating an example configuration of a semiconductor memory device in which the number of the bit lines is increased 16 times using 2 bit line selector circuits and sense amplifiers.

FIG. 8 is a block diagram illustrating an example configuration of a semiconductor memory device in which the number of the bit lines is increased by 16 times using 2-bit line selector circuits and sense amplifiers.

The semiconductor memory device shown in FIG. 8 has memory cell array 1, bit line selector circuits 2_A and 2_B, sense amplifiers 3_A and 3_B, latch circuits 4_A and 4_B, and switch circuits 5_A and 5_B.

Memory cell array 1A has plural memory cells arranged in rows and columns, and 16 columns of memory cells are connected to 16 bit line pairs. Said 16 bit line pairs are divided into 2 blocks, each comprising 8 pairs, one of the 2 blocks (referred to as Block A hereinafter) is connected to bit line selector circuit 2_A, and the other (referred to as Block B hereinafter) is connected to bit line selector circuit 2_B.

In addition, like memory cell array 1, memory cells in each row are connected to a common word line, and the memory cells are accessed by activating specific word lines and bit line pairs.

Bit line selector circuit 2_A selects 1 bit line pair out of the 8 bit line pairs of Block A according to bit line selection signal SB and outputs the signals on the selected bit line pair to sense amplifier 3_A.

Bit line selector circuit 2_B selects 1 bit line pair out of the 8 bit line pairs of Block B according to bit line selection signal SB and outputs the signals on the selected bit line pair to sense amplifier 3_B.

Said bit line selector circuits 2_A and 2_B can be configured using a circuit similar to bit selector circuit 2 of the semiconductor memory device in FIG. 7.

Sense amplifier 3_A amplifies the small difference in the voltage of bit line pair selected by bit line selector circuit 2_A when enable signal EN (not shown) changes from low level to high level during a read of the stored data. Since said voltage difference is amplified, either output terminal SA_A or SAZ_A is set to the high level, and the other is set to the low level.

Sense amplifier 3_B amplifies the small difference in the voltage of bit line pair selected by bit line selector circuit 2_B when enable signal EN (not shown) changes from the low level to the high level during a read of stored data. Since said voltage difference is amplified, either output terminal SA_B or SAZ_B is set to the high level, and the other is set to the low level.

Said amplification operation is performed by one of the 2 sense amplifiers 3_A or 3B, whichever is selected according to block selection signal line SM.

Latch circuit 4_A outputs a high-level or low-level signal SL_A to switch circuit 5_A according to the levels of signals of output terminals SA_A and SAZ_A of sense amplifier 3_A. When output terminals SA_A and SAZ_A are both at the high level, the level of output signal SL_A is held.

Latch circuit 4_B outputs a high-level or low-level signal SL_B to switch circuit 5_B according to the levels of signals of output terminals SA_B and SAZ_B of sense amplifier 3_B. When output terminals SA_B and SAZ_B are both at the high level, the level of output signal SL_B is held.

Switch circuit 5_A and switch circuit 5_B are connected to a common output terminal, wherein, one of the switch circuits, the one selected by block selection enable signal SMEN, is turned on, and the other switch circuit is turned off. The signal latched by latch circuit 4_A is output when switch circuit 5_A is turned on, or the signal latched by latch circuit 4_B is output when switch circuit 5_B is turned on, and sent to the common output terminal as read signal SAOUT from a memory cell.

The operation of the semiconductor memory device in FIG. 8 will be explained with reference to the timing diagram in FIG. 9.

Figure 9:
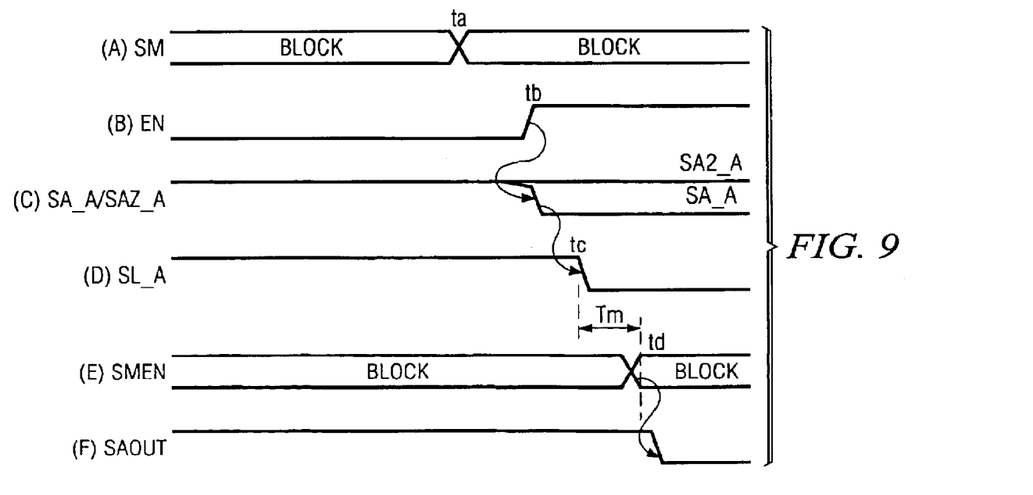
FIG. 9 is a timing diagram illustrating an example of the timing relationship among the respective signals of the semiconductor memory device shown in FIG. 8.

In the timing diagram in FIG. 9, Block B of the 2 bit line pair blocks is selected by block selection signal SM (FIG. 9A) and block selection enable signal SMEN (FIG. 9E) in the initial stage. Thus, switch circuit 5_B is turned on, and high-level signal latched by latch circuit 4_B is output as read signal SAOUT (FIG. 9F). In addition, because the input terminal of sense amplifier 3_A has been charged to the power supply voltage by a precharger not illustrated, output terminals SA_A and SAZ_A (FIG. 9C) are both at the high level. Output signal SL_A (FIG. 9D) of latch circuit 4_A is kept at the high level.

Once a new address for reading data is set at time ta, bit line selection signal SB and block selection signal SM are updated. In the case of the example in FIG. 9, the selection of a block based on block selection signal SM (FIG. 9A) changes from Block B to Block A. In addition, 1 of the word lines of memory cell array 1A is activated in response to the setting of said new read address, the bit line pair is driven by the memory cells connected to the activated word line, and a voltage difference corresponding to the data stored in the memory cells is generated on the bit line pair.

Once enable signal EN changes from the low level to the high level at time tb, sense amplifier 3_A selected based on block selection signal SM begins the amplification operation, wherein, output terminal SA_A changes to the low level, and output terminal SAZ_A changes to the high level. Upon receiving said changes in the levels of the output terminals, output signal SL_A (FIG. 9D) of latch circuit 4_A changes from the high level to the low level at time tc. When the block selection is changed from Block B to Block A according to block selection enable signal SMEN (FIG. 9E) at time td, that is, when appropriate time margin Tm has passed after time tc, switch circuit 5_A is turned on, switch circuit 5_B is turned off, and low-level signal latched by latch circuit 4_A is output as output signal SAOUT.

With the semiconductor memory device in FIG. 8, while the number of the transistors of the bit line selector circuit that acts as a load to the bit lines remains the same as that of the semiconductor memory device in FIG. 7, the number of the memory cells can be doubled compared with the semiconductor memory device in FIG. 7.

However, in the case of the semiconductor memory device in FIG. 8, time margin Tm must be provided so as to fully assure output signals SL_A and SL_B of latch circuits 4_A and 4_B prior to the selection of a latch circuit by block selection enable signal SMEN in order to prevent an invalid signal from appearing as output signal SAOUT. Therefore, disadvantageously, the access speed decreases in proportion to said time margin Tm. Also disadvantageously, because the timing of block selection enable signal SMEN must be controlled to match the requirement of time margin Tm, a suitable circuit must be added for this purpose.

The present invention was conceived in light of the foregoing problems, and its purpose is to present a semiconductor memory device with which the access time can be further improved and the aforementioned memory capacity can be increased without increasing the loading of the bit lines.

SUMMARY OF THE INVENTION

In order to solve the aforementioned problems, the semiconductor memory device of the present invention is provided with a memory cell array containing plural memory cells which are arranged in the form of a matrix between plural bit line pairs divided into plural blocks each comprising a prescribed number of bit line pairs and plural word lines, plural bit line selector circuits which are provided in correspondence to the aforementioned respective plural blocks so as to select 1 bit line pair from the aforementioned prescribed number of bit line pairs and electrically connect said selected bit line pair to an output line pair, plural bit line charge circuits which charge each of the aforementioned plural output line pairs to a prescribed signal level, plural amplifier circuits that amplify the difference in the signal levels generated on the aforementioned respective plural output line pairs according to data stored in the selected memory cell, a block selector circuit which selects one of the aforementioned plural output line pairs provided in correspondence to the aforementioned plural blocks according to a block selection signal and electrically connects said selected output line pair to a selectable output line pair, and a data latch circuit which latches output data when the signal level of the aforementioned selectable output line pair is not a complementary signal level and outputs first data or second data corresponding to the complementary signal level, either a first or a second complementary signal level, indicated by the signal level of the aforementioned selectable output line pair.

The configuration may be such that the aforementioned block selector circuit has plural gate circuits connected respectively between the aforementioned plural output line pairs and the aforementioned selectable output line pair, and the aforementioned plural gate circuits comprise first and second switch circuits connected between one side of the aforementioned output line pair and the other side and between one side of the aforementioned selectable output line pair and the other side, respectively, in order to control the aforementioned first and the second switch circuits to conduct or not conduct according to a control signal.

Furthermore, the configuration may be such that the aforementioned plural bit line selector circuits have first and second data write circuits connected to one side and the other side of the aforementioned prescribed number of bit line pairs, and the aforementioned first and the second data write circuits supply complementary signals to one side and the other side of the aforementioned bit line pair in response to a write signal.

REFERENCE NUMERALS AND SYMBOLS AS SHOWN IN THE DRAWINGS

In the figures, 10 represents a memory cell array, 20 through 27 represent bit line selector circuits, 30 through 37 charge circuits, 40 through 47 amplifier circuits, 50 through 57 and 50A through 57A gate circuits, 60 represents a block selector circuit, 70 a data latch circuit, 201-0 through 201-7, 202-0 through 202-7, and 301 through 303 represent p-type MOS transistors, 203-0 through 203-7 and 204-0 through 204-7 n-type MOS transistors, 205-0 through 205-7 and 265-0 through 206-7 NOR gates, 207-0 through 207-7, 701, and 702 NAND gates, 208-0 through 208-7, 505, and 703 inverters, 209, 304, 402, and 506 controller circuits, 503 and 504 clocked inverters, 507 and 508 transfer gates.

DESCRIPTION OF THE EMBODIMENTS

Two embodiments of the present invention will be explained below with reference to figures.

First Embodiment

Figure 1:
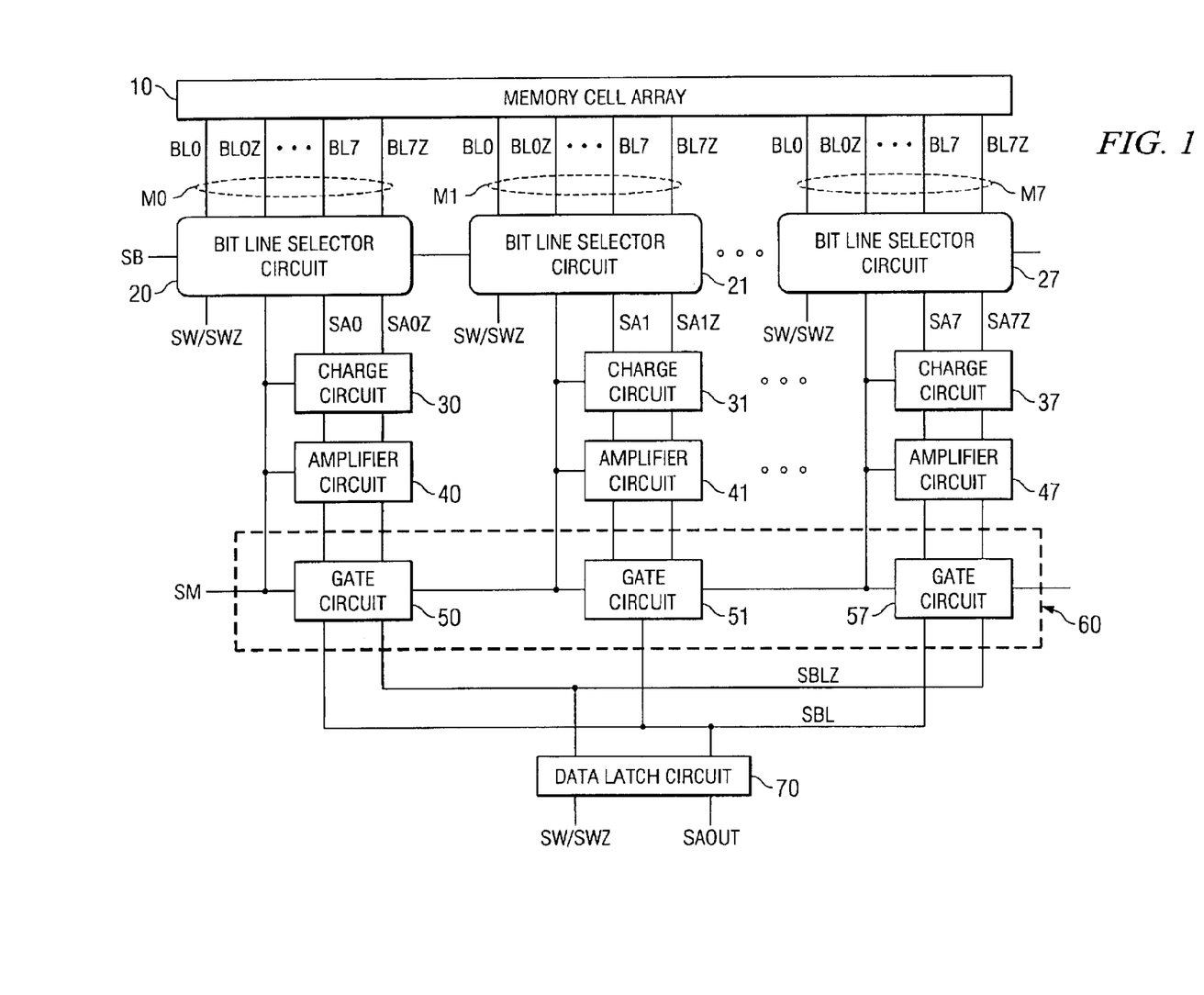
FIG. 1 is a block diagram illustrating an example configuration of the semiconductor memory device pertaining to a first embodiment of the present invention.

FIG. 1 is a block diagram illustrating an example configuration of the semiconductor memory device pertaining to a first embodiment of the present invention.

The semiconductor memory device illustrated in the example in FIG. 1 has memory cell array 10, bit line selector circuits 20 through 27, charge circuits 30 through 37, amplifier circuits 40 through 47, block selector circuit 60, and data latch circuit 70.

Memory cell array 10 represents the plural memory cells of the present invention. Bit line selector circuits 20 through 27 represent the plural bit line selector circuits of the present invention.

Charge circuits 30 through 37 represent the plural bit line charge circuits of the present invention.

Amplifier circuits 40 through 47 represent the plural amplifier circuits of the present invention.

Block selector circuit 60 represents the block selector circuit of the present invention.

Data latch circuit 70 represents the data latch circuit of the present invention.

Memory cell array 10 has plural memory cells arranged in a matrix with 64 columns of memory cells and 64 bit line pairs. Said 64 bit line pairs are divided into 8 blocks M0 through M7 each comprising 8 pairs, and the respective bit line pairs of said blocks M0 through M7 are connected to bit line selector circuits 20 through 27.

In addition, although it is not specifically illustrated, the memory cells in each row are connected to a common word line. During an operation for reading data stored in memory cell array 10 (referred to as read mode hereinafter) or an operation for writing data to memory cell array 10 (referred to as write mode hereinafter), of those word lines, the word line corresponding to the destination address to be accessed is activated, and access is gained to the memory cells connected to the activated word line.

Bit line selector circuit $2i$ (where i represents an integer from 0 to 7) selects 1 of the 8 bit line pairs contained in block Mi according to bit line selection signal SB. During read mode, the signals on said selected bit line pair are output to output line pair (SAi, SAiZ). In addition, during write mode, the 2 bit lines of said selected bit line pair are set to the high level or the low level, respectively, according to write signals SW and SWZ.

Figure 2:
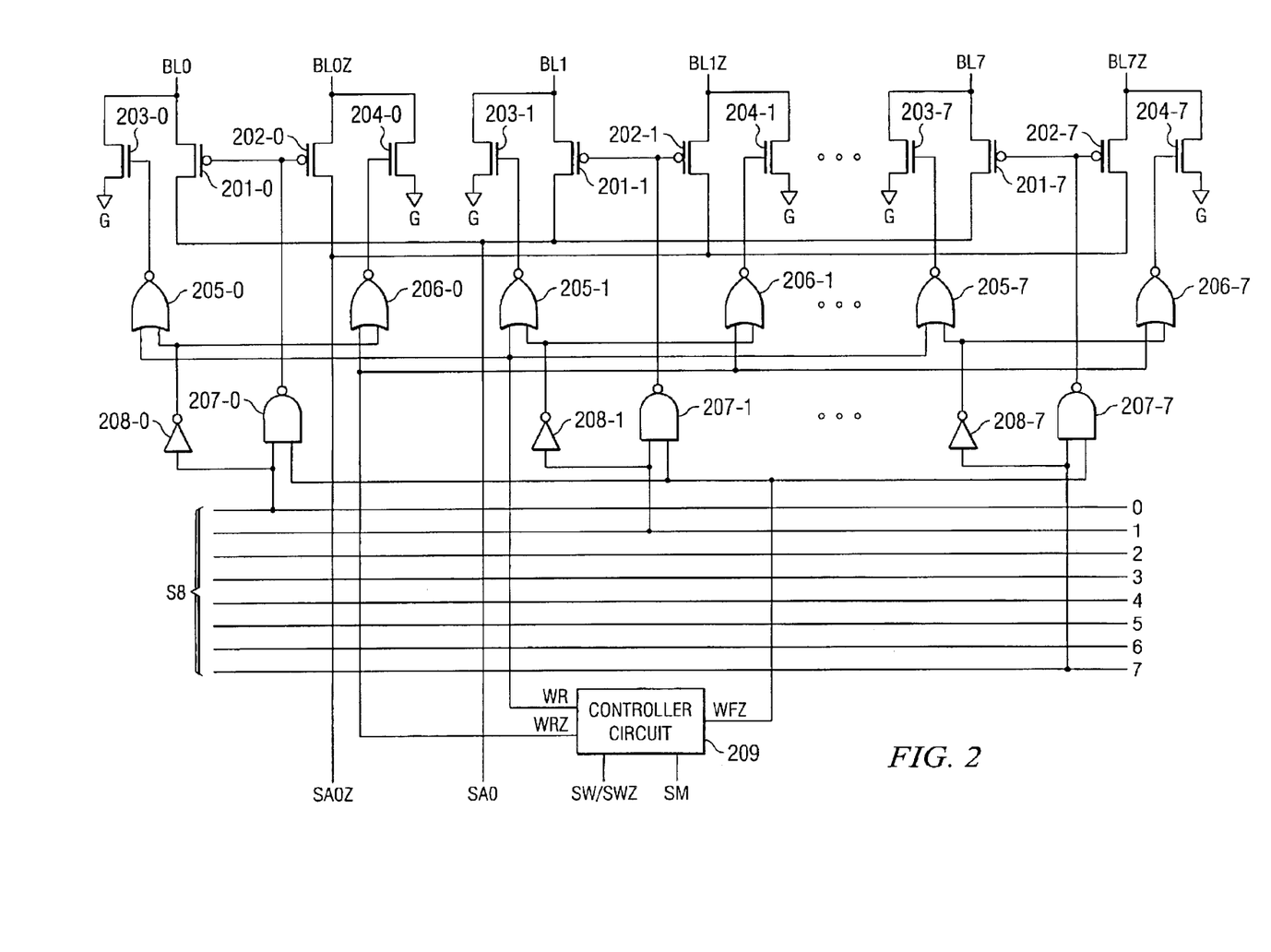
FIG. 2 is a block diagram illustrating an example configuration of a bit line selector circuit.

FIG. 2 is a block diagram illustrating an example configuration of bit line selector circuit 20.

Bit line selector circuit 20 shown in the example in FIG. 2 has p-type MOS transistors 201-0 through 201-7, p-type MOS transistors 202-0 through 202-7, n-type MOS transistors 203-0 through 203-7, n-type MOS transistors 204-0 through 204-7, NOR gates 205-0 through 205-7, NOR gates 206-0 through 206-7, NAND gates 207-0 through 207-7, inverters 208-0 through 208-7, and controller circuit 209.

Bit line BLj (where j represents an integer from 0 to 7) is connected to output line SA0 via p-type MOS transistor 201-$j$ as well as to reference potential line G via n-type MOS transistor 203-$j$.

Bit line BLjZ is connected to output line SA0Z via p-type MOS transistor 202-$j$ as well as to reference potential line G via n-type MOS transistor 204-$j$.

Output signal of NAND gate 207-$j$ is input to the gates of p-type MOS transistor 201-$j$ and p-type MOS transistor 202-$j$. Output signal of NOR gate 205-$j$ is input to the gate of n-type MOS transistor 203-$j$. Output signal of NOR gate 206-$j$ is input to the gate of n-type MOS transistor 204-$j$.

Write signal WR output from controller circuit 209 and output signal of inverter 208-j are input to the 2 input terminals of NOR gate 205-j. Write signal WRZ output from controller circuit 209 and output signal from inverter circuit 208-j are input to the 2 input terminals of NOR gate 206-j. Control signal WFZ output from controller circuit 209 and the selection signal in the jth bit of bit line selection signal are input to the 2 input terminals of NAND gate 207-j. The selection signal in the jth bit of bit line selection signal SB is input to the input terminal of inverter circuit 208-j.

When block M0 is selected by block selection signal SM while in write mode, controller circuit 209 outputs write signal WR and write signal WRZ having the same signal levels as those of write signals SW and SWZ input, or it sets write signals WR and WRZ to the high level otherwise.

In addition, block M0 is selected by block selection signal SM while in read mode, controller circuit 209 sets control signal WFZ to the high level, or it sets control signal WFZ to the low level otherwise.

The operations of bit line selector circuit 20 with the aforementioned configuration will now be explained.

Because signal WFZ is set to the low level by controller circuit 209 when block M0 is selected by block selection signal SM while in write mode, the output signal of NAND gate 207-j goes to the high level, and p-type MOS transistors 201-0 through 201-7 and p-type MOS transistors 202-0 through 202-7 are all turned off. In addition, the signal levels of write signals WR and WRZ become the same as those of write signals SW and SWZ.

Assuming that the selection signal in the jth bit of bit line selection signal SB is at the high level, and all the other bits of the selection signal are at the low level under said condition, the output signal of inverter circuit 208-j goes to the low level, the output signal of NOR gate 205-j and the output signal of NOR gate 206-j go to the high level or the low level according to the signal level of write signal SW and the signal level of write signal SWZ, respectively. N-type MOS transistor 203-j and N-type MOS transistor 204-j turn on or off according to said output signals of NOR gate 205-j and NOR gate 206-j, and bit line BLj and bit line BLjZ go to the high level or the low level accordingly.

For example, when write signal SW is at the high level and write signal SWZ is at the low level, n-type MOS transistor 203-j is turned off, n-type MOS transistor 204-j is turned on, bit line BLj goes to the high level, and bit line BLjZ goes to the low level. On the other hand, when write signal SW is at the low level, and SWZ is at the high level, bit line BLj goes to the low level, and BLjZ goes to the high level.

Because write signals WR and WRZ are both set to the high level when block M0 is not selected by block selection signal SM while in write mode, output signals of NOR gates 205-0 through 205-7 and NOR gates 206-0 through 206-7 all go to the low level, n-type MOS transistors 203-0 through 203-7 and n-type MOS transistors 204-0 through 204-7 are all turned off. That is, the operations for writing to memory cells corresponding to write signals SW and SWZ are not executed.

Because control signal WFZ is set to the high level when block M0 is selected by block selection signal SM while in read mode, output signals of NAND gates 207-0 through 207-7 go to the high level or the low level according to bit line selection signal SB.

That is, assuming that the selection signal in the jth bit of bit line selection signal SB is at the high level and that the selection signals in the other bits are at the low level, the output signal of NAND gate 207-j goes to the low level and the output signals of the other NAND gates go to the high level, so that only p-type MOS transistors 201-j and 202-j are turned on. As a result, bit line pair (BLj, BLjZ) becomes connected to output line pair (SA0, SA0Z).

Because control signal WFZ is set to the low level when block M0 is not selected by block selection signal SM while in read mode, p-type MOS transistors 201-0 through 201-7 and p-type MOS transistors 202-0 through 202-7 are off, and all bit line pairs are disconnected from output line pair (SA0, SA0Z). That is, no operation for reading from block M0 is executed.

Furthermore, because write signals WR and WRZ are both set to the high level in read mode, n-type MOS transistors 203-0 through 203-7 and n-type MOS transistors 204-0 through 204-7 are off.

While the aforementioned explanation pertains to bit line selector circuit 20, the other bit line selector circuits 21 through 27 also have a similar configuration to that of bit line selector circuit 20 and operate similarly.

The explanation will resume with reference to FIG. 1.

Charge circuit 3i charges both signal levels of output lines SAi and SAiZ of bit line selector circuit 2i to the power supply voltage before the memory cells become accessible through the bit line pair while in read mode. Said charging to the power supply voltage (referred to as precharge hereafter) stops when the memory cells in block Mi become accessible through the bit line pair.

Amplifier circuit 3i amplifies the difference in the signal levels corresponding to the data stored in the memory cells which generated on output line pair (SAi, SAiZ) of bit line selector circuit 2i when the memory cells become accessible through the bit line pair as block Mi is selected by block selection signal SM while in read mode. As a result of said amplification of the signal level difference, one of the output lines, that is, either SAi or SAiZ, goes to the high level, and the other goes to the low level.

Block selector circuit 60 selects 1 bit line pair out of output line pairs (SA0, SA0Z) through (SA7, SA7Z) of bit line selector circuits 20 through 27 according to block selection signal SM and outputs the signals on the selected bit line pair to selectable bit line pair (SBL, SBLZ).

In the example in FIG. 1, block selector circuit 60 has gate circuits 50 through 57.

Gate circuit 5i outputs the signals on output line pair (SAi, SAiZ) of bit line selector circuit 2i to selectable bit line pair (SBL, SBLZ) when block Mi is selected by block selection signal SM. It sets the output impedance with respect to selectable bit line pair (SBL, SBLZ) to the high-impedance state when block Mi is not selected by block selection signal SM.

Output signals from gate circuits 50 through 57 are input to data latch circuit 70 via selectable bit line pair (SBL, SBLZ).

When the signals levels of selectable bit line SBL and selectable bit line SBLZ are different, that is, either selectable bit line SBL or selectable bit line SBLZ is at the high level, and the other is at the low level, data latch circuit 70 outputs high-level or low-level signal SAOUT according to the combination of said signal levels. For example, it outputs high-level signal SAOUT when selectable bit line SBL is at the high level, and selectable bit line SBLZ is at the low level; and it outputs low-level signal SAOUT when selective bit line SBL is at the low level, and selectable bit line SBLZ is at the high level.

In addition, when selectable bit line SBL and selectable bit line SBLZ are both at the high level, it latches signal SAOUT currently output.

Figure 3:
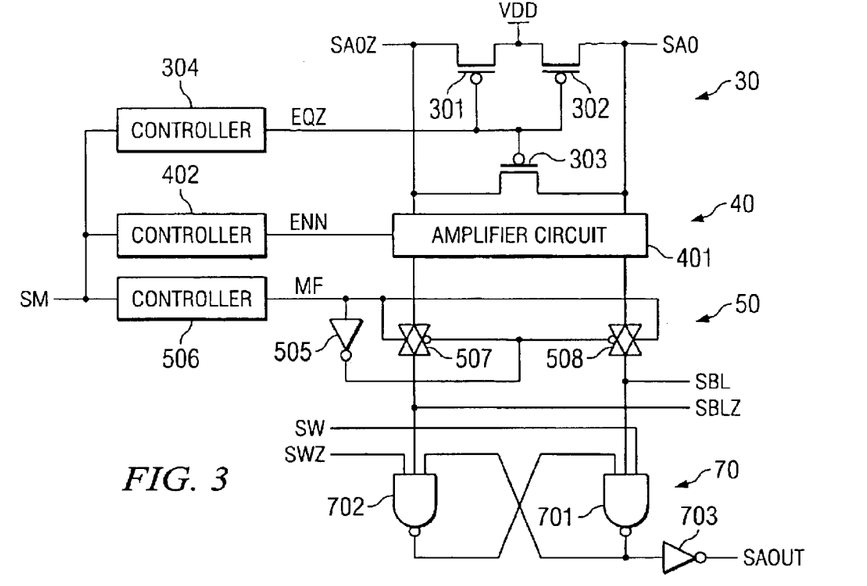
FIG. 3 is a block diagram illustrating an example configuration of the semiconductor memory device pertaining to the first embodiment of the present invention comprising a charge circuit, an amplifier circuit, a gate circuit, and a data latch circuit.

FIG. 3 is a block diagram illustrating an example configuration of the semiconductor memory device in FIG. 1 comprising charge circuit 30, amplifier circuit 40, gate circuit 50, and data latch circuit 70. Reference designators common to FIG. 3 and FIG. 1 indicate the same elements.

In the example in FIG. 3, charge circuit 30 has p-type MOS transistors 301 through 303 and controller circuit 304. Amplifier circuit 40 comprises amplifier 401 and controller circuit 402. Gate circuit 50 comprises inverter circuit 505, transfer gates 507 and 508 and controller circuit 506. Data latch circuit 70 comprises NAND gates 701 and 702 and inverter circuit 703.

Transfer gates 507 and 508 represent the first switch circuit and the second switch circuit of the present invention.

P-type MOS transistor 301 and p-type MOS transistor 302 are connected in series between output line SA0 and output line SA0Z of bit line selector circuit 20, and the node between p-type MOS transistor 301 and p-type MOS transistor 302 is connected to power source line VDD. P-type MOS transistor 303 is connected between output line SA0 and output line SA0Z of bit line selector circuit 20. Control signal EQZ of controller circuit 304 is input to the gates of p-type MOS transistors 301 through 303.

Controller circuit 304 sets control signal EQZ to the low level before the memory cells become accessible through the bit line pair while in read mode in order to make p-type MOS transistors 301 through 303 conduct. Then, when block M0 is selected by block selection signal SM, and the memory cells in block M0 have become accessible through the bit line pair while in read mode, it sets control signal EQZ to the high level in order to turn on p-type MOS transistors 301 through 303.

Amplifier circuit 401 amplifies the signal level difference corresponding to the data stored in the memory cells which is generated on output line pair (SA0, SA0Z) of bit line selector circuit 20 according to control signal ENN of controller circuit 402.

Controller circuit 402 outputs control signal ENN in order for amplifier circuit 401 to execute the amplification operation when block M0 is selected by block selection signal SM, and the memory cells in block M0 have become accessible through the bit line pair while in read mode.

Transfer gate 507 is inserted in the connection line between output line SA0Z and selectable bit line SBLZ. Transfer gate 508 is inserted in the connection line between output line SA0 and selectable bit line SBL. Transfer gates 507 and 508 are turned on when control signal MF of controller circuit 506 is at the high level and output signal of inverter 505 is at the low level; and it is turned off when control signal MF is at the low level and the output signal of inverter 505 is at the high level. Control signal MF is input to the input terminal of inverter 505.

Controller circuit 506 sets control signal MF to the high level when block M0 is selected by block selection signal SM, and it sets control signal MF to the low level when block M0 is not selected by block selection signal SM.

Output signal of NAND gate 702, selectable bit line SBL signal, and write signal SW are input to the 3 input terminals of NAND gate 701. The output signal of NAND gate 701, selectable bit line SBLZ signal, and write signal SWR are input to the 3 input terminals of NAND gate 702. The output signal of NAND gate 701 is input to the input terminal of inverter circuit 703, and signal SAOUT is output from its output terminal.

Next, the operation of the semiconductor memory device with the aforementioned configuration during write and read modes will be explained.

(Write Mode)

Figure 4:
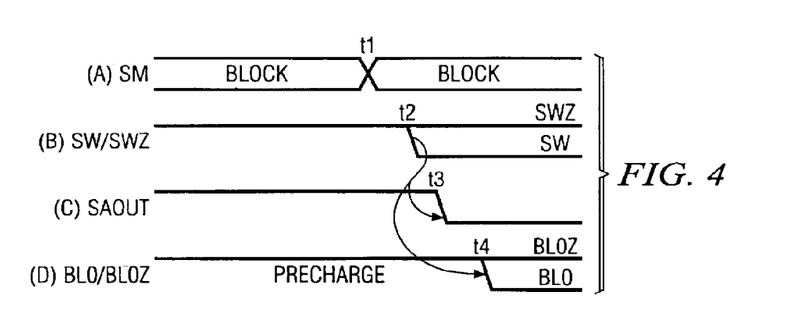
FIG. 4 is a timing diagram showing the timing relationship among respective signals during write mode.

FIG. 4 is a timing diagram showing the timing relationship among the respective signals during write mode.

In the timing diagram of FIG. 4, block M1 is selected by block selection signal SM (FIG. 4A) in the initial stage. Write signals SW and SWZ (FIG. 4B) are both set to the high level. Bit lines BL0 and BL0Z (FIG. 4D) of block M1 are precharged to the power supply voltage. Output signal SAOUT (FIG. 4C) of data latch circuit 70 is held at the high level.

When a new address for writing to memory cell array 10 is set at time t1, bit line selection signal SB and block selection signal SM are updated accordingly. In the example in FIG. 4, the block selection by block selection signal SM (FIG. 4A) is changed from block M1 to block M0. In addition, the selection signal for the 0th bit of bit line selection signal SB goes to the high level, and the selection signals for the 1st through the 7th bits go to the low level.

Furthermore, when the new write address is set, the word line of memory cell array 10 corresponding to said address is activated, and the memory cells connected to the activated word line become accessible through the bit line pair.

When write signal SW is set to the low level, and write signal SWZ is set to the high level at time t2 (FIG. 4B), output signal of NAND gate 701 in data latch circuit 70 goes to the high level, and output signal of NAND gate 702 goes to the low level. As a result, output signal SAOUT of data latch circuit 70 changes to the low level at time t3 (FIG. 4C).

In addition, when write signal SW is set to the low level and write signal SWZ is set to the high level, low-level write signal WR and high-level write signal WRZ are output from controller circuit 209 of bit line selector circuit 20 to NOR gates 205-0 and 206-Z. Thus, the output signal of NOR gate 205-0 goes to the high level, and the output signal of NOR gate 206-0 goes to the low level. As a result, at time t4, n-type MOS transistor 203-0 is turned on, and n-type MOS transistor 204-0 is turned off, so that bit line BL0 goes to the low level, and bit line BL0Z goes to the high level (FIG. 4D).

Furthermore, because internal write signals WR and WRZ are set to the high level at bit line selector circuits 21 through 27 of blocks M1 through M7, which are not selected by block selection signal SM, regardless of write signals SW and SWZ input, no operation for writing to the memory cells is executed.

As described above, when a new write address is set while in write mode, bit line selection signal SB and block selection signal SM are updated according to said address, and the word line of memory cell array 10 corresponding to said address is activated. The write data input in the form of write signals SW and SWZ are written to the memory cells connected to the activated word line of memory cell array 10 through the bit line pair specified by bit line selection signal SB and block selection signal SM. In addition, write data input in the form of write signal SW and SWZ are input directly into data latch circuit 70, where they are held.

(Read Mode)

Figure 5:
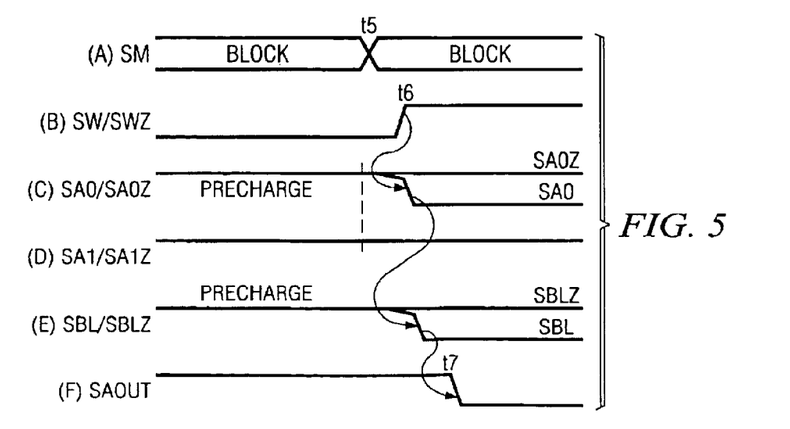
FIG. 5 is a timing diagram showing the timing relationship among respective signals during read mode.

FIG. 5 is a timing diagram showing the timing relationship among the respective signals during read mode.

In the timing diagram of FIG. 5, block M1 is selected by block selection signal SM (FIG. 5A) in the initial stage. In addition, amplification operations by amplifier circuits 40 through 47 are stopped (FIG. 5B), output lines of bit line selector circuits 20 through 27 are precharged to the power supply voltage by charge circuits 30 through 37 (FIGS. 5C,D), and the signal levels of the selective bit line pair (SBL, SBLZ) are set to the high level (FIG. 5E). Output signal SAOUT (FIG. 4C) of data latch circuit 70 is held at the high level.

When a new address for reading from memory cell array 10 is set at time t5, bit line selection signal SB and block selection signal SM are updated accordingly. In the example in FIG. 5, the block selection by block selection signal SM (FIG. 5A) is changed from block M1 to block M0.

When the block selection is changed from block M1 to block M0, the signals to be output from block selector circuit 60 to selectable bit line pair (SBL, SBLZ) are switched from the signals on output line pair (SA1, SA1Z) to the signals on output line pair (SA0, SA0Z). However, because the output lines of bit line selector circuits 20 through 27 are precharged to the power supply voltage by charge circuits 30 through 37 before time t5 is reached, and the signal levels of output line pair (SA0, SA0Z) and output line pair (SA1, SA1Z) are at the high level (FIGS. 5C,D), selectable bit line pair (SBL, SBLZ) remains at the high level even after said switching (FIG. 5E). Therefore, the output signal of data latch circuit 70 is maintained (FIG. 5F).

In addition, according to the updated read address, the word line of memory cell array 10 corresponding to said address is activated at time t5, and the memory cells connected to the activated word line become accessible through the bit line pair. As a result, a voltage difference corresponding to the data stored in the memory cells is generated gradually (FIG. 5C) on output line pair (SA0, SA0Z) of bit line selector circuit 20. Thus, a voltage difference is generated gradually on selective bit line pair (SBL, SBLZ) also (FIG. 5E).

Furthermore, the charging operation of charge circuit 30 is stopped while the memory cells are accessible through the bit line pair. Thus, the data stored in the memory cells is never rewritten due to the charging operation of charge circuit 30.

When amplifier circuit 401 begins the amplification operation at time t6 in response to control signal ENN (FIG. 5B) from controller circuit 402, the voltage difference generated on output line pair (SA0, SA0Z) is amplified quickly; and output line SA0 goes to the low level, and output line SA0Z goes to the high level (FIG. 5C). Accordingly, selectable bit line SBL goes to the low level, and selectable bit line SBLZ goes to the high level (FIG. 5E).

When selectable bit line SBL goes to the low level and selectable bit line SBLZ goes to the high level, output signal SAOUT of data latch circuit 70 changes from high level to low level at time t7 (FIG. 5F).

When further access is to be gained to the next memory cell for a read, because output line pairs (SA0, SA0Z) through (SA7, SA7Z) are precharged by charge circuits 30 through 37 before said access is gained, and selectable bit line pair (SBL, SBLZ) goes to the high level, the data previously read is kept as output signal SAOUT of data latch circuit 70. As is also evident at time t5, because output line pairs (SA0, SA0Z) through (SA7, SA7Z) are all at the high level, even when the block selection by block selection signal SM is changed subsequently in response to a new read address, the data previously read is held as output signal SAOUT of data latch circuit 70. Output signal SAOUT of data latch circuit 70 changes to the next read data as soon as the amplification operations of amplifier circuits 40 through 47 are completed.

As described above, with the semiconductor memory device in FIG. 1, because the read data are finalized at the point that the data latched by data latch circuit 70 is rewritten on the basis of the result of the amplification by amplifier circuits 40 through 47, there is no need to provide the time margin required by the semiconductor memory device of FIG. 8 in order to delay the switching of the output signal by the switch circuit until valid data is latched into the latch circuit, so that the time for reading stored data can be reduced.

In addition, because such a signal as block selection enable signal SMEN of the semiconductor memory device in FIG. 8 which requires timing control so as to meet the requirements of the time margin is no longer needed, the corresponding circuit can be eliminated.

In addition, even when the signals on the output line pairs of bit line selector circuits 20 through 27 are switched by block selector circuit 60 as a new read address is set, because the output line pairs are precharged by charge circuits 30 through 37, the data in data latch circuit 70 is held before and after the switching of the signals. Therefore, invalid data can be prevented from being output as output signal SAOUT.

Second Embodiment

A second embodiment of the present invention will now be explained.

The semiconductor memory device of the second embodiment is different from the semiconductor memory device of the first embodiment in that the gate circuits are configured differently.

For example, gate circuits 50 through 57 of the semiconductor memory device in FIG. 1 are replaced with gate circuits 50A through 57A to be described below.

Figure 6:
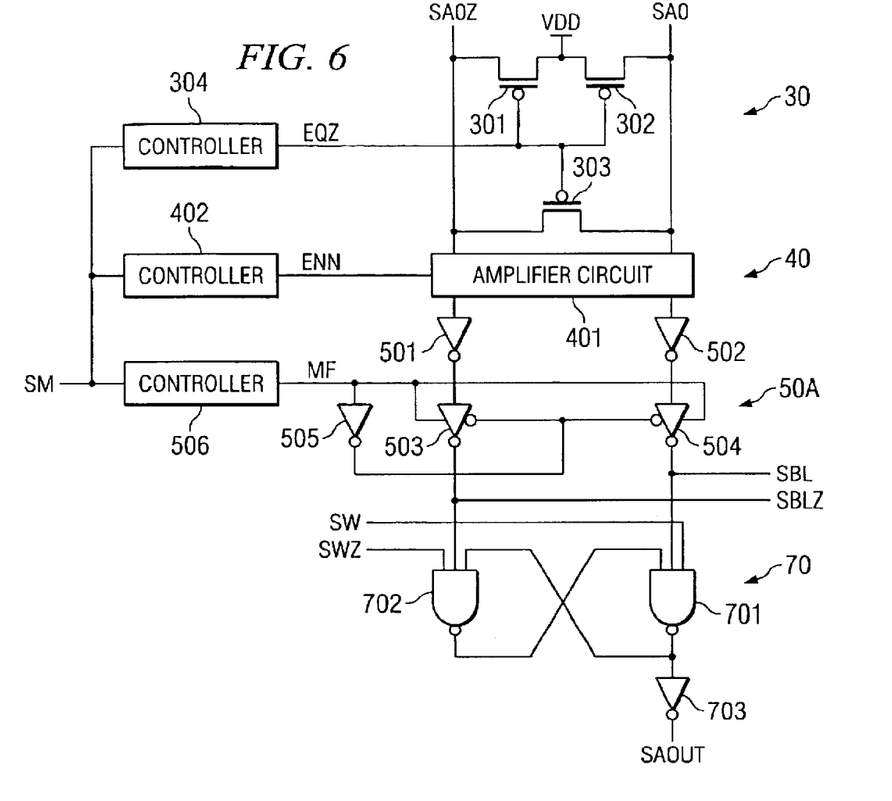
FIG. 6 is a block diagram illustrating an example configuration of the semiconductor memory device pertaining to the second embodiment of the present invention comprising a charge circuit, an amplifier circuit, a gate circuit, and a data latch circuit.

FIG. 6 is a block diagram illustrating an example configuration of the semiconductor memory device pertaining to the second embodiment of the present invention comprising charge circuit 30, amplifier circuit 40, gate circuit 50A, and data latch circuit 70. Here, the reference designators common to FIG. 6 and FIG. 1 indicate the same elements.

In the example in FIG. 6, gate circuit 50A has inverter circuits 501, 502, and 505; clocked inverter circuits 503 and 504; and controller circuit 506.

Input terminal of inverter circuit 501 is connected to output line SA0Z of bit line selector circuit 20, and its output terminal is connected to the input terminal of clocked inverter circuit 503. The output terminal of clocked inverter circuit 503 is connected to selectable bit line SBLZ.

The input terminal of inverter circuit 502 is connected to output line SA0 of bit line selector circuit 20, and its output terminal is connected to the input terminal of clocked inverter circuit 504. The output terminal of clocked inverter circuit 504 is connected to selectable bit line SBL.

Clocked inverter circuit 503 functions as a conventional inverter when control signal MF is at the high level, and the output signal of inverter circuit 505 is at the low level, wherein it inverts output signal of inverter circuit 501 and outputs it to selectable bit line SBLZ. When control signal MF is at the low level and output signal of inverter circuit 505 is at the high level, it sets the output impedance for selective bit line SBLZ to the high-impedance state and shuts off current from the output to selectable bit line SBLZ.

Similarly, clocked inverter circuit 504 functions as a conventional inverter when control signal MF is at the high level, and output signal of inverter circuit 505 is at the low level, wherein it inverts output signal of inverter circuit 502 and outputs it to selectable bit line SBL. When control signal MF is at the low level and output signal of inverter circuit 505 is at the high level, it sets the output impedance for selectable bit line SBL to the high-impedance state.

When control signal MF of controller circuit 506 goes to the high level as block M0 is selected by block selection signal SM, the signal on output line SA0Z is inverted by inverter circuit 501, said inverted signal is again inverted by clocked inverter circuit 503, and the same signal as the signal on output line SA0Z is output to selectable bit line SBLZ as a result. Similarly, the signal on output line SA0 is inverted by inverter circuit 502, said inverted signal is again inverted by clocked inverter circuit 504, and the same signal as the signal on output line SA0 is output to selectable bit line SBL as a result.

In addition, when block M0 is not selected by block selection signal SM and control signal MF of controller circuit 506 goes to the low level, the outputs of clocked inverter circuits 503 and 504 both go to the high-impedance state, and the signals on output line pair (SA0, SA0Z) are not output to selectable bit line pair (SBL, SBLZ).

Although the explanation above pertains to gate circuit 50A, the other gate circuits 51A through 57A are also configured and operate similar to gate circuit 50A.

As described above, in the case of the semiconductor memory device pertaining to the second embodiment, the use of inverter circuits and clocked inverter circuits for the gate circuits make it difficult for unwanted signals, such as noise, generated on selectable bit line pair (SBL, SBLZ) to propagate from a gate circuit to a memory cell compared with the case of the semiconductor memory device in FIG. 1 which uses transfer gates for the gate circuits. As a result, the number of gate circuits to be connected to selectable bit pair (SBL, SBLZ) can be increased, so that the memory capacity can be further increased.

The present invention is not limited by the aforementioned embodiments.

For example, the number of blocks of bit line pairs and the number of bit line pairs in each block described above are merely examples; any number can be used.

In the present invention, the memory capacity can be increased without increasing the load to the bit lines and the access speed can be improved.

What is claimed is:

1. A semiconductor memory device comprising
   a memory cell array containing plural memory cells which are arranged in the form of a matrix between plural bit line pairs divided into plural blocks each comprising a prescribed number of bit line pairs and plural word lines,
   plural bit line selector circuits which are provided in correspondence to the aforementioned respective plural blocks so as to select 1 bit line pair from the aforementioned prescribed number of bit line pairs and electrically connect said selectable bit line pair to an output line pair,
   plural bit line charge circuits which charge each of the aforementioned plural output line pairs to a prescribed signal level,
   plural amplifier circuits which amplify the difference in the signal levels generated on the aforementioned respective plural output line pairs according to data stored in the selected memory cell,
   a block selector circuit which selects one of the aforementioned plural output line pairs provided in correspondence to the aforementioned plural blocks according to a block selection signal and electrically connects said selected output line pair to a selectable output line pair, and
   a data latch circuit which latches output data when the signal level of the aforementioned selective output line pair is not a complementary signal level and outputs first data or second data corresponding to the complementary signal level, either a first or a second complementary signal level, indicated by the signal level of the aforementioned selectable output line pair.

2. The semiconductor memory device of claim 1, in which the aforementioned block selector circuit has plural gate circuits connected between the aforementioned plural output line pairs and the aforementioned selectable output line pair, and
   the aforementioned plural gate circuits have first and second switch circuits connected between one side of the aforementioned output line pair and the other side and between one side of the aforementioned selectable output line pair and the other side, in order to control the aforementioned first and second switch circuits to conduct or not conduct in accordance with a control signal.

3. The semiconductor memory device of claim 2, in which the aforementioned first and the second switch circuits are transfer gates.

4. The semiconductor memory device of claim 1, in which the aforementioned block selector circuit has plural gate circuits connected between the aforementioned plural output line pairs and the aforementioned selectable output line pair,
   the aforementioned plural gate circuits have first and second inverter circuits connected between one side of the aforementioned output line pair and the other side and between one side of the aforementioned selective output line pair and the other side, respectively, in order to control the aforementioned first and the second inverter circuits to output either an output signal corresponding to an input signal or a high-impedance signal in response to a control signal.

5. The semiconductor memory device of claim 4, in which the aforementioned first and the second inverter circuits are clocked inverter circuits.

6. The semiconductor memory device of claim 1 in which the aforementioned plural bit line selector circuits have first and second data write circuits connected to one side and the other side of the aforementioned prescribed number of bit line pairs, and the aforementioned first and the second data write circuits supply complementary signals to one side and the other side of the aforementioned bit line pair in response to a write signal.

7. The semiconductor memory device of claim 6, in which the aforementioned first and the second data write circuits are configured with first and second transistors connected respectively between one side of the aforementioned bit line pair and a power supply terminal.

* * * * *